(12) United States Patent
Kawase et al.

(10) Patent No.: US 9,156,096 B2
(45) Date of Patent: Oct. 13, 2015

(54) TOOL CUTTING APPARATUS AND TOOL CUTTING METHOD FOR WORKPIECE

(75) Inventors: Masayuki Kawase, Ota-Ku (JP); Takashi Mori, Ota-Ku (JP); Ryoji Tanimoto, Ota-ku (JP)

(73) Assignee: Disco Corporation, Tokyo (JP)

(*) Notice: Subject to any disclaimer, the term of this patent is extended or adjusted under 35 U.S.C. 154(b) by 687 days.

(21) Appl. No.: 13/469,367

(22) Filed: May 11, 2012

(65) Prior Publication Data

US 2012/0294690 A1    Nov. 22, 2012

(30) Foreign Application Priority Data

May 18, 2011  (JP) ................................. 2011-111728

(51) Int. Cl.
*B23Q 11/10* (2006.01)
*B23C 3/00* (2006.01)
*H01L 21/67* (2006.01)

(52) U.S. Cl.
CPC .............. *B23C 3/00* (2013.01); *B23Q 11/1061* (2013.01); *H01L 21/67092* (2013.01); *B23B 2222/44* (2013.01); *B23B 2222/84* (2013.01); *B23B 2226/31* (2013.01); *B23B 2250/12* (2013.01); *B23C 2222/84* (2013.01); *B23C 2226/31* (2013.01); *B23C 2250/12* (2013.01); *Y10T 409/50082* (2015.01); *Y10T 409/500984* (2015.01)

(58) Field of Classification Search
CPC .............. B23Q 11/10; B23Q 11/1061; B23Q 11/1076; Y10T 409/303796; Y10T 409/304032; Y10T 409/303752; Y10T 409/303808; Y10T 408/44; Y10T 408/45; Y10T 408/458; Y10T 408/455; Y10T 408/46; B23C 3/13; B23C 2215/00; B23C 2220/48
USPC .................. 408/56, 57, 59–61; 409/135–136, 409/131–132
IPC ....................................................... B23Q 11/10
See application file for complete search history.

(56) References Cited

U.S. PATENT DOCUMENTS

| 1,825,685 | A | * | 10/1931 | Trosch .......................... 409/136 |
| 2,745,318 | A | * | 5/1956 | Williams ........................ 409/136 |
| 5,228,369 | A | * | 7/1993 | Itoh et al. ........................ 82/1.11 |
| 6,123,270 | A | * | 9/2000 | Hara ................................. 239/8 |
| 6,746,185 | B2 | * | 6/2004 | Hubbard et al. .............. 408/1 R |
| 2002/0033081 | A1 | * | 3/2002 | Hara ............................... 82/1.11 |

FOREIGN PATENT DOCUMENTS

| JP | 04025309 A | * | 1/1992 |
| JP | 2001150294 A | * | 6/2001 |
| JP | 2004-319669 | | 11/2004 |
| JP | 2006123143 A | * | 5/2006 |
| JP | 2009-13301 | | 1/2009 |
| JP | 2010-036300 | | 2/2010 |

* cited by examiner

*Primary Examiner* — Daniel Howell
(74) *Attorney, Agent, or Firm* — Greer Burns & Crain Ltd.

(57) ABSTRACT

A tool cutting apparatus includes a chuck table for holding a workpiece, and rotatable cutting means having a cutting tip for cutting the front side of the workpiece. Pure water and an additive are mixed to prepare a cutting fluid, and a cutting fluid nozzle supplies the cutting fluid to the cutting tip and the workpiece held on the chuck table.

4 Claims, 5 Drawing Sheets

TOOL CUTTING APPARATUS AND TOOL CUTTING METHOD FOR WORKPIECE

BACKGROUND OF THE INVENTION

1. Field of the Invention

The present invention relates to a tool cutting apparatus including a cutting tool for cutting a workpiece and also to a tool cutting method for a workpiece.

2. Description of the Related Art

There are various techniques for realizing a reduction in size and weight of a semiconductor device. For example, a mounting technique called flip chip bonding has been put to practical use. This mounting technique is such that a plurality of metal projections called bumps each having a height of about 10 to 100 μm are formed on the front side of each device formed on a semiconductor wafer and these bumps are directly bonded to electrodes formed on a wiring board. The bumps on the device surface of the semiconductor wafer are formed by plating or a stud bump method. Accordingly, the heights of the individual bumps are not uniform, so that it is difficult to uniformly bond all the bumps to the electrodes of the wiring board.

Further, as a technique for realizing high-density wiring, there is an integrated circuit mounting technique such that an anisotropic conductive film (ACF) is interposed between the bumps and the wiring board to be bonded. In this mounting technique, the heights of the bumps must be uniformed because the lack of the height of any bump causes faulty bonding. It is therefore desirable to cut the plural bumps formed on the front side of a semiconductor wafer so that the heights of all the bumps become a desired height. As a method of cutting the bumps to a desired height, there has been proposed a cutting method using a tool cutting apparatus as disclosed in Japanese Patent Laid-Open No. 2010-36300.

The tool cutting apparatus includes a tool wheel composed of a wheel base and a tool unit provided on the wheel base, wherein the tool unit includes a cutting tip formed of diamond. In cutting a workpiece by using the tool cutting apparatus, the tool wheel is mounted on a spindle and rotated by rotating the spindle, and the cutting tip of the tool unit is brought into abutment against the workpiece, thereby making the cutting tip slide on the tool wheel and the workpiece

SUMMARY OF THE INVENTION

The tool cutting apparatus is suitable for cutting of the bumps formed on the front side of a semiconductor wafer to a desired height. However, when the workpiece containing a material having a high affinity for diamond forming the cutting tip of the tool unit, such as nickel, titanium, iron, and kovar is cut by the tool cutting apparatus, high-temperature processing heat is generated to cause rapid wearing of the cutting tip.

It is therefore an object of the present invention to provide a tool cutting apparatus and a tool cutting method which can prevent rapid wearing of the cutting tip to extend the life of the cutting tip.

In accordance with an aspect of the present invention, there is provided a tool cutting apparatus including: a chuck table having a holding surface for holding a workpiece; rotatable cutting means having a cutting tip for cutting the front side of the workpiece held on the chuck table; first feeding means for relatively moving the chuck table and the cutting means in a direction parallel to the holding surface of the chuck table; second feeding means for relatively moving the chuck table and the cutting means in a direction perpendicular to the holding surface of the chuck table; a pure water source for supplying a pure water; an additive source for supplying an additive; a mixing unit for mixing the pure water supplied from the pure water source and the additive supplied from the additive source to prepare a cutting fluid; and a cutting fluid nozzle for supplying the cutting fluid prepared by the mixing unit to the cutting tip of the cutting means and the workpiece held on the chuck table.

Preferably, the additive does not contain 0.1 mass % or more of a water-insoluble component and contains 0.001 to 50 mass % of a polymer having 50 mass % or more of a monomer unit represented by the general formula (1)

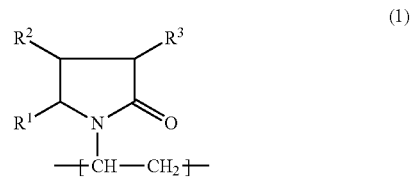

wherein each of $R^1$ to $R^3$ stands for a hydrogen atom or a hydrocarbon radical having one to eight carbon atoms.

Preferably, the additive is diluted 500 to 10000 times with the pure water in the mixing unit.

In accordance with another aspect of the present invention, there is provided a tool cutting method including: a holding step of holding a workpiece on a chuck table having a holding surface for holding the workpiece in the condition where the back side of the workpiece is in contact with the holding surface and the front side of the workpiece is exposed; a cutting step of relatively moving the chuck table holding the workpiece and a rotatable cutting means having a cutting tip in a horizontal direction and feeding the cutting tip of the cutting means into the workpiece by a predetermined depth from the front side of the workpiece as rotating the cutting means, thereby cutting the front side of the workpiece; and a cutting fluid supplying step of supplying a cutting fluid prepared by mixing a pure water and an additive to the cutting tip of the cutting means and the workpiece held on the chuck table.

According to the tool cutting apparatus and the tool cutting method of the present invention, the cutting fluid prepared by mixing the additive in the pure water is supplied from the cutting fluid nozzle to the workpiece and the cutting tip in cutting the workpiece. Accordingly, even when the workpiece contains a material having a high affinity for diamond, the workpiece can be cut by the cutting tip of the cutting means and rapid wearing of the cutting tip can be prevented to thereby extend the life of the cutting tip.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
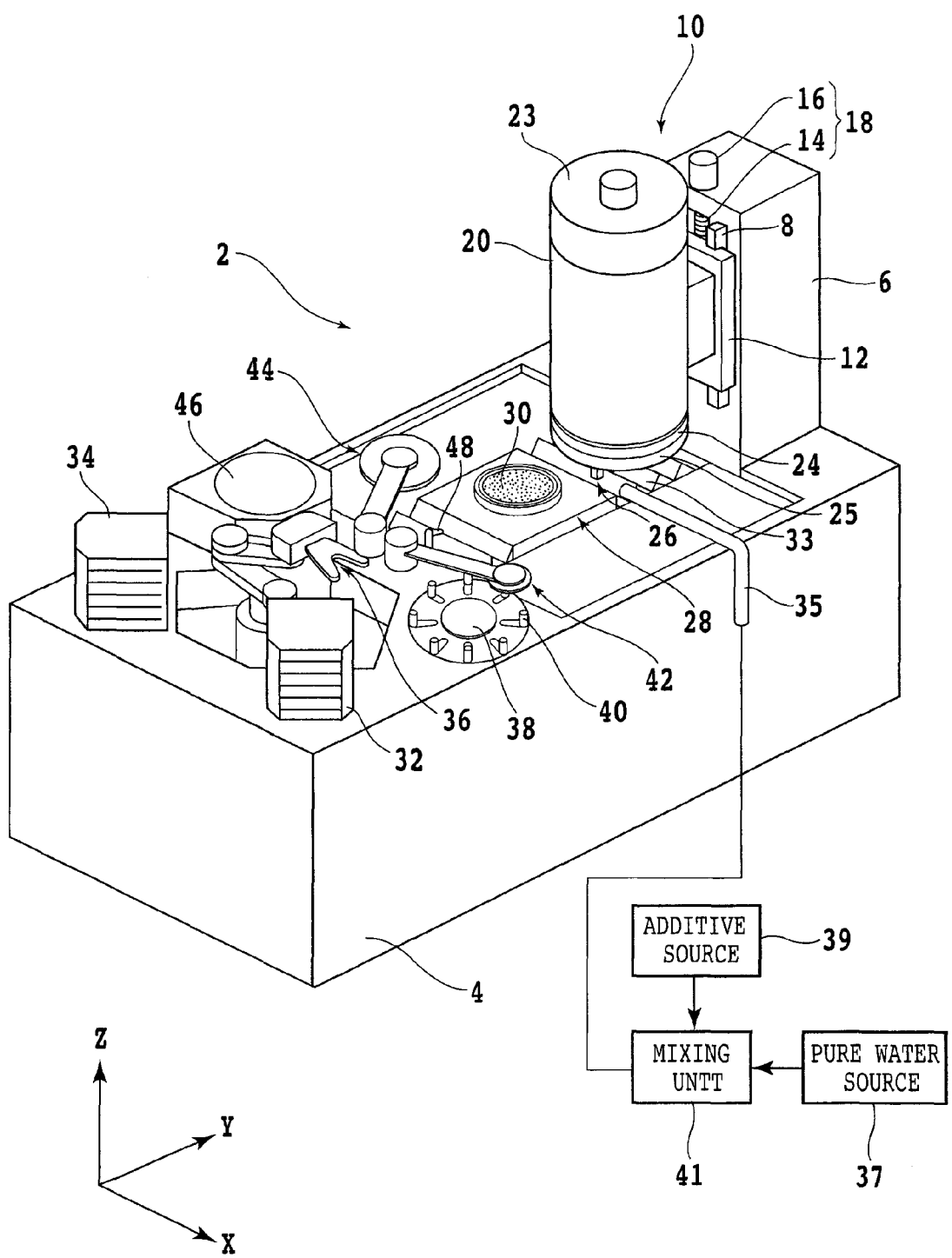
FIG. 1 is a perspective view of a tool cutting apparatus according to the present invention.

A preferred embodiment of the present invention will now be described in detail with reference to the drawings. FIG. 1 is a perspective view of a tool cutting apparatus 2 according to a preferred embodiment of the present invention. Reference numeral 4 denotes a base (housing) of the tool cutting apparatus 2. A column 6 stands on the upper surface of the base 4 at a rear portion thereof. A pair of vertically extending guide rails (one of which being shown) 8 are fixed to the column 6. A tool cutting unit 10 is mounted on the column 6 so as to be vertically movable along the guide rails 8. The tool cutting unit 10 has a housing 20 and a moving support 12 for supporting the housing 20, wherein the moving support 12 is vertically movable along the guide rails 8.

The tool cutting unit 10 includes the housing 20, a spindle (not shown) rotatably accommodated in the housing 20, a mount 24 fixed to the lower end of the spindle, a tool wheel 25 detachably mounted on the lower surface of the mount 24, and a motor 23 for rotationally driving the spindle. The tool wheel 25 is provided with a detachable tool unit 26. The tool cutting unit 10 is vertically moved along a pair of the guide rails 8 by a tool cutting unit feeding mechanism 18 including a ball screw 14 and a pulse motor 16. That is, when the pulse motor 16 is operated, the ball screw 14 is rotated to thereby vertically move the moving support 12, thus vertically moving the tool cutting unit 10.

A chuck table mechanism 28 having a chuck table 30 is provided on the upper surface of the base 4 at an intermediate portion thereof. The chuck table mechanism 28 is movable in the Y direction by a chuck table moving Mechanism (not shown). A bellows 33 is provided to cover the chuck table mechanism 28. There are further provided on the upper surface of the base 4 at a front portion thereof a first wafer cassette 32, a second wafer cassette 34, a wafer transfer robot 36, a positioning mechanism 38 having a plurality of positioning pins 40, a wafer loading mechanism (loading arm) 42, a wafer unloading mechanism (unloading arm) 44, and a spinner cleaning unit 46.

Further, a cleaning water nozzle 48 for cleaning the chuck table 30 is provided at a substantially central portion of the base 4. When the chuck table 30 is moved to a front position as a wafer loading/unloading position as shown in FIG. 1, the cleaning water nozzle 48 is operated to direct a cleaning water toward the chuck table 30.

Figure 2:
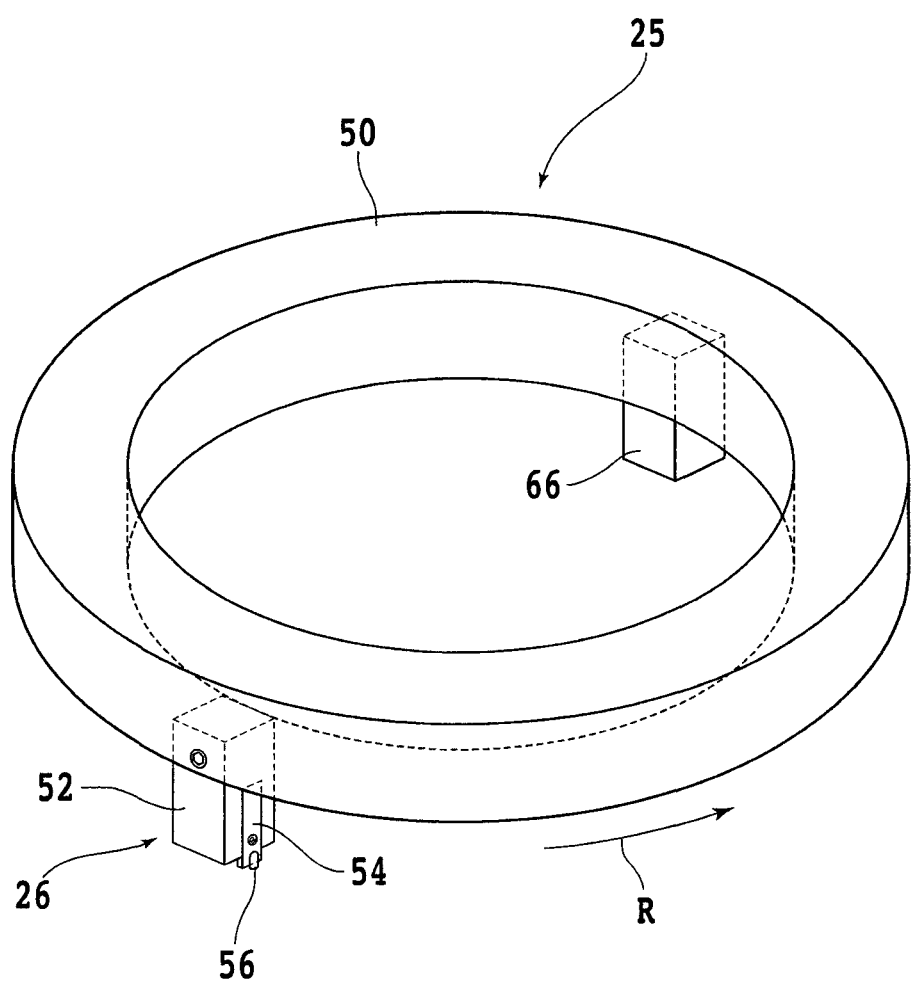
FIG. 2 is a perspective view of a tool wheel.

Referring next to FIG. 2, there is shown a perspective view of the tool wheel 25. The tool wheel 25 is composed of an annular wheel base 50, the tool unit 26 detachably mounted on the wheel base 50, and a balancing weight (counter weight) 66 detachably mounted on the wheel base 50 at a position symmetric to the tool unit 26 with respect to the center of rotation of the wheel base 50, wherein the balancing weight 66 has the same weight as that of the tool unit 26. The tool wheel 25 is rotated in the direction shown by an arrow R in FIG. 2 to cut bumps formed on the front side of a wafer (not shown) as a workpiece.

Figure 3:
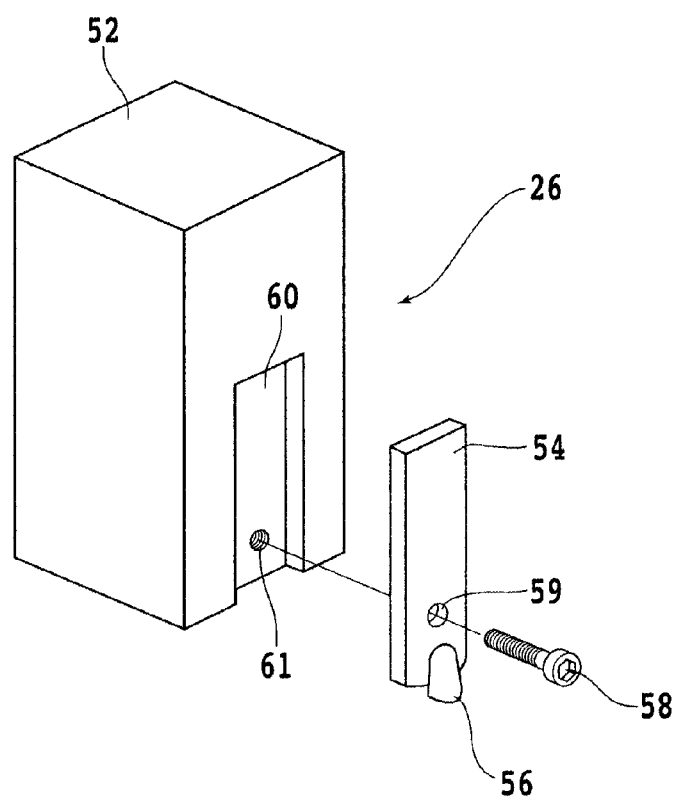
FIG. 3 is an exploded perspective view of a tool unit.

Referring next to FIG. 3, there is shown an exploded perspective view of the tool unit 26. The tool unit 26 is composed of a shank (tool shank) 52 having a rectangular parallelepiped shape and a cutting tool 54 detachably mounted on the shank 52. The cutting tool 54 has a platelike shape and it is provided with a cutting tip 56. The cutting tip 56 is fixed at a longitudinal end (lower end) of the cutting tool 54 on the front side thereof. The cutting tip 56 is formed of diamond and has a predetermined shape. The cutting tool 54 is formed with a round hole (through hole) 59 for insertion of a screw 58.

A pit 60 having a depth equal to the thickness of the cutting tool 54 is formed on one side surface of the shank 52. The bottom surface of the pit 60 is formed with a tapped hole 61 aligned to the round hole 59 of the cutting tool 54 in its mounted condition. The cutting tool 54 is fitted in the pit 60 of the shank 52 and the screw 58 is inserted through the round hole 59 of the cutting tool 54 and threadedly engaged with the tapped hole 61 of the pit 60 of the shank 52, thereby fixing the cutting tool 54 to the shank 52.

Figure 4A:
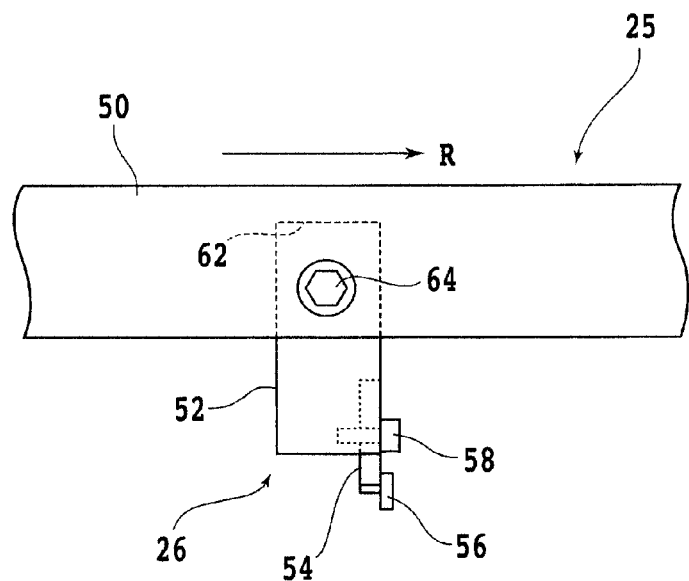
FIG. 4A is a side view showing a mounting structure of the tool unit to a wheel base.
Figure 4B:
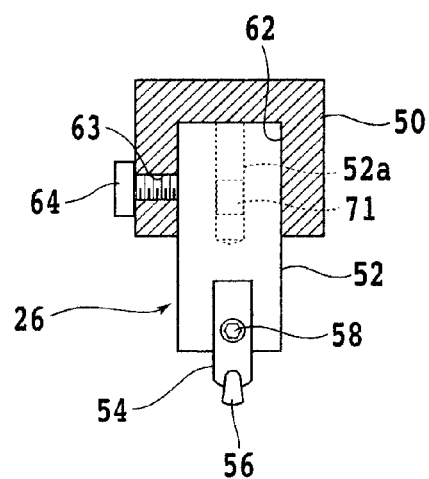
FIG. 4B is a partially sectional elevational view of the mounting structure shown in FIG. 4A.

As shown in FIGS. 4A and 4B, the wheel base 50 is formed with a mounting hole 62 having a rectangular parallelepiped shape and a tapped hole 63 opening to the mounting hole 62. The shank 52 of the tool unit 26 is inserted in the mounting hole 62 of the wheel base 50 and a screw 64 is threadedly engaged with the tapped hole 63 of the wheel base 50 to hold the shank 52 in the mounting hole 62, thereby fixing the tool unit 26 to the wheel base 50.

Figure 5A:
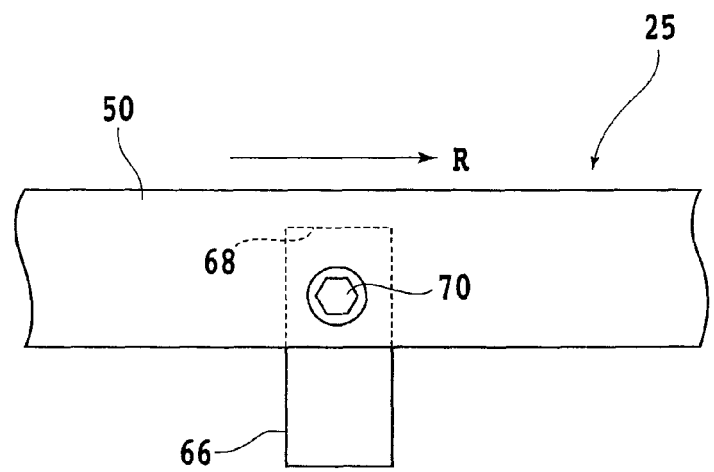
FIG. 5A is a side view showing a mounting structure of a balancing weight to the wheel base.
Figure 5B:
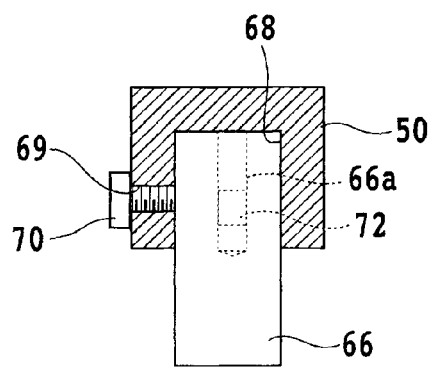
FIG. 5B is a partially sectional elevational view of the mounting structure shown in FIG. 5A.

On the other hand, as shown in FIGS. 2, 5A, and 5B, the balancing weight 66 having the same weight as that of the tool unit 26 is inserted in a mounting hole 68 formed on the wheel base 50 at a position symmetric to the tool unit 26 with respect to the center of rotation of the wheel base 50. A screw 70 is threadedly engaged with a tapped hole 69 opening to the mounting hole 68 to hold the balancing weight 66 in the mounting hole 68, thereby fixing the balancing weight 66 to the wheel base 50.

Referring again to FIG. 1, a cutting fluid nozzle 35 is provided in the vicinity of the tool wheel 25 of the tool cutting unit 10. A pure water source 37 is provided to supply a pure water, and an additive source 39 is provided to supply an additive. Further, mixing unit 41 is provided to mix the pure water supplied from the pure water source 37 and the additive supplied from the additive source 39, thereby preparing a cutting fluid. The cutting fluid thus prepared by the mixing unit 41 is sent to the cutting fluid nozzle 35 and then supplied from the cutting fluid nozzle 35 to the tool unit 26 and a workpiece held on the chuck table 30 in cutting the workpiece by using the tool unit 26. The additive to be supplied from the additive source 39 does not contain 0.1 mass % or more of a water-insoluble component and contains 0.001 to 50 mass % of a polymer having 50 mass % or more of a monomer unit represented by the general formula (1)

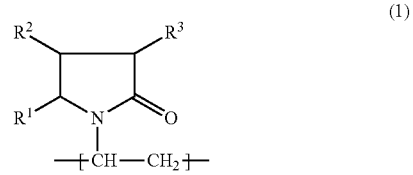

(1)

wherein each of $R^1$ to $R^3$ stands for a hydrogen atom or a hydrocarbon radical having one to eight carbon atoms.

The polymer may be a polymer having 50 mass % or more of the monomer unit represented by the above general formula (1). Each of $R^1$ to $R^3$ in the general formula (1) stands for a hydrogen atom or a hydrocarbon radical having one to eight carbon atoms. Examples of such a hydrocarbon radical include an alkyl group such as methyl, ethyl, propyl, butyl, tertiary butyl, pentyl, hexyl, heptyl, octyl, and 2-ethylhexyl groups; an alkenyl group such as vinyl, allyl, propenyl, isopropenyl, butenyl, isobutenyl, pentenyl, isopentenyl, hexenyl, heptenyl, and octenyl groups; and an aryl group such as phenyl, tolyl, and xylyl groups.

The additive for the cutting fluid is an aqueous solution containing the polymer mentioned above. However, this additive must not contain 0.1 mass % or more of a water-insoluble component. The water-insoluble component generally means a water-insoluble substance and more particularly means a substance having a water solubility of 0.1 mass % or less.

Examples of such a water-insoluble component include a synthetic resin such as polystyrene, polyvinyl chloride, acrylic resin, alkyd resin, polyethylene, phenol resin, silicone resin, urea resin, melamine resin, unsaturated polyester, fluororesin, polyamide resin, and a mixture obtained by mixing these resins in an arbitrary ratio; a synthetic oil such as poly-α-olefin, ethylene-α-olefin copolymer, polybutene, alkyl benzene, alkyl naphthalene, polyalkylene glycol, polyphenyl ether, alkyl substituted diphenyl ether, polyol ester, dibasic acid ester, carbonic acid ester, silicone oil, and fluorinated oil; a mineral oil such as paraffin mineral oil and naphthene mineral oil; a hydrocarbon solvent such as benzene, toluene, xylene, hexane, and pentane; and a halogen solvent such as trichloroethane and dichloromethane.

Preferably, in the mixing unit 41, the additive is diluted 500 to 10000 times with the pure water supplied from the pure water source 37.

EXAMPLE 1

A workpiece containing nickel was held under suction on the chuck table 30, and the spindle of the tool cutting unit 10 was rotated at about 2000 rpm. In this condition, the tool cutting unit feeding mechanism 18 was driven to feed the cutting tip 56 of the tool unit 26 into the workpiece by a predetermined depth. At this time, the cutting fluid obtained by diluting the additive with the pure water by a factor of 750 was supplied from the cutting fluid nozzle 35 to the workpiece, and the chuck table 30 was moved at a feed speed of 1 mm/s in the Y direction, thus cutting the front side of the workpiece.

As a result, 22 workpieces could be cut until the cutting tip 56 of the tool unit 26 was worn out. In the case of using a related-art tool cutting apparatus such that only a pure water was supplied to the workpiece in cutting, seven workpieces could be cut under the same conditions.

Accordingly, as compared with the related-art tool cutting apparatus using only a pure water, the tool cutting apparatus according to the present invention using the cutting fluid obtained by mixing the additive to the pure water and supplied from the cutting fluid nozzle 35 has an advantage such that the life of the cutting tip 56 of the tool unit 26 can be extended about three times.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A tool cutting apparatus comprising:
   a chuck table having a holding surface for holding a workpiece;
   rotatable cutting means having a cutting tip for cutting a front side of said workpiece held on said chuck table;
   first feeding means for relatively moving said chuck table and said cutting means in a direction parallel to said holding surface of said chuck table;
   second feeding means for relatively moving said chuck table and said cutting means in a direction perpendicular to said holding surface of said chuck table;
   a pure water source for supplying a pure water;
   an additive source for supplying an additive;
   a mixing unit for mixing said pure water supplied from said pure water source and said additive supplied from said additive source to prepare a cutting fluid; and
   a cutting fluid nozzle for supplying said cutting fluid prepared by said mixing unit to said cutting tip of said cutting means and said workpiece held on said chuck table;
   wherein said additive does not contain 0.1 mass % or more of a water-insoluble component and contains 0.001 to 50 mass % of a polymer having 50 mass % or more of a monomer unit represented by the general formula (1)

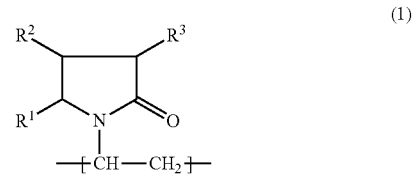

wherein each of $R^1$ to $R^3$ stands for a hydrogen atom or a hydrocarbon radical having one to eight carbon atoms.

2. The tool cutting apparatus according to claim 1, wherein said additive is diluted 500 to 10000 times with said pure water in said mixing unit.

3. A tool cutting method comprising:
   a holding step of holding a workpiece on a chuck table having a holding surface for holding said workpiece in a condition where a back side of said workpiece is in contact with said holding surface and a front side of said workpiece is exposed;
   a cutting step of relatively moving said chuck table holding said workpiece and a rotatable cutting means having a cutting tip in a horizontal direction and feeding said cutting tip of said cutting means into said workpiece by a predetermined depth from the front side of said workpiece as rotating said cutting means, thereby cutting the front side of said workpiece; and
   a cutting fluid supplying step of supplying a cutting fluid prepared by mixing a pure water and an additive to said cutting tip of said cutting means and said workpiece held on said chuck table;
   wherein said additive does not contain 0.1 mass % or more of a water-insoluble component and contains 0.001 to 50 mass % of a polymer having 50 mass % or more of a monomer unit represented by the general formula (1)

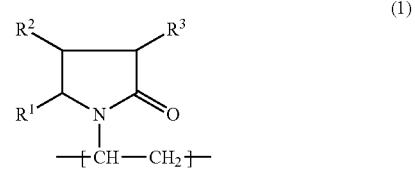

wherein each of $R^1$ to $R^3$ stands for a hydrogen atom or a hydrocarbon radical having one to eight carbon atoms.

4. The tool cutting method according to claim 3, wherein said additive is diluted 500 to 10000 times with said pure water.

* * * * *